(12) United States Patent
Pugel et al.

(10) Patent No.: US 7,710,503 B2
(45) Date of Patent: May 4, 2010

(54) APPARATUS AND METHOD FOR OPTIMIZING THE LEVEL OF RF SIGNALS BASED UPON THE INFORMATION STORED ON A MEMORY

(75) Inventors: Michael Anthony Pugel, Noblesville, IN (US); Max Ward Muterspaugh, Indianapolis, IN (US)

(73) Assignee: Thomson Licensing, Issy les Moulineaux (FR)

( * ) Notice: Subject to any disclaimer, the term of this patent is extended or adjusted under 35 U.S.C. 154(b) by 791 days.

(21) Appl. No.: 10/380,717

(22) PCT Filed: Sep. 25, 2001

(86) PCT No.: PCT/US01/29807

§ 371 (c)(1),
(2), (4) Date: Mar. 18, 2003

(87) PCT Pub. No.: WO02/27924

PCT Pub. Date: Apr. 4, 2002

(65) Prior Publication Data

US 2004/0029537 A1    Feb. 12, 2004

Related U.S. Application Data

(60) Provisional application No. 60/235,038, filed on Sep. 25, 2000.

(51) Int. Cl.
*H04N 5/00* (2006.01)
*H04B 17/00* (2006.01)
*H04B 1/06* (2006.01)
*H04N 5/44* (2006.01)
*H04N 5/50* (2006.01)

(52) U.S. Cl. .................. 348/731; 348/607; 348/725; 348/570; 455/226.1; 455/234.1

(58) Field of Classification Search ............. 348/607, 348/731; 455/115.1–115.4, 226.1–226.4, 455/234.1, 253.2
See application file for complete search history.

(56) References Cited

U.S. PATENT DOCUMENTS 3,984,776 A * 10/1976 Stedman ................. 455/205
5,321,847 A *  6/1994 Johnson, Jr. ............ 455/63.1

(Continued)

FOREIGN PATENT DOCUMENTS

EP    969601    1/2000

(Continued)

OTHER PUBLICATIONS

Patent Abstract of Japan, JP 2001 077713.

*Primary Examiner*—Brian P Yenke
(74) *Attorney, Agent, or Firm*—Robert D. Shedd; Joseph J. Opalach; Brian J. Cromarty

(57) ABSTRACT

A signal processing arrangement has a signal source for providing a radio frequency (RF) signal, a signal output point, and first control means coupled between the signal source and the signal output point for controlling the selection of a low noise figure amplifier in response to the magnitude of an RF signal on a tuned channel frequency and the magnitude of an RF signal in the vicinity of said tuned channel frequency.

2 Claims, 4 Drawing Sheets

U.S. PATENT DOCUMENTS

| | | | |
|---|---|---|---|
| 5,465,410 A * | 11/1995 | Hiben et al. | 455/266 |
| 5,510,859 A * | 4/1996 | Douglass et al. | 348/731 |
| 5,524,285 A * | 6/1996 | Wray et al. | 455/126 |
| 5,758,271 A * | 5/1998 | Rich et al. | 455/234.1 |
| 5,898,730 A * | 4/1999 | Hensley et al. | 375/224 |
| 5,940,143 A * | 8/1999 | Igarashi et al. | 348/678 |
| 5,974,106 A * | 10/1999 | Dupont et al. | 375/377 |
| 5,995,135 A * | 11/1999 | Limberg | 348/21 |
| 6,148,189 A * | 11/2000 | Aschwanden | 455/234.1 |
| 6,222,592 B1 * | 4/2001 | Patel | 348/614 |
| 6,370,367 B1 * | 4/2002 | Monge-Navarro et al. | 455/226.1 |
| 6,445,425 B1 * | 9/2002 | Limberg | 348/731 |
| 6,771,719 B1 * | 8/2004 | Koyama et al. | 375/345 |
| 6,944,427 B2 * | 9/2005 | Haub et al. | 455/63.1 |
| 2004/0041945 A1 * | 3/2004 | Pugel et al. | 348/470 |

FOREIGN PATENT DOCUMENTS

| | | | |
|---|---|---|---|
| EP | 999649 | * | 5/2000 |
| JP | 2001-077713 | | 3/2001 |
| WO | 95/09494 | | 4/1995 |
| WO | 99/30426 | | 6/1999 |

* cited by examiner

APPARATUS AND METHOD FOR OPTIMIZING THE LEVEL OF RF SIGNALS BASED UPON THE INFORMATION STORED ON A MEMORY

This application claims the benefit under 35 U.S.C. §365 of International Application PCT/US01/29807, filed Sep. 25, 2001, which was published in accordance with PCT Article 21(2) on Apr. 4, 2002 in English; and which claims benefit of U.S. provisional application Ser. No. 60/235,038 filed Sep. 25, 2000.

The present invention concerns radio frequency (RF) signal processing arrangement and method for optimizing the level of RF signals, suitable for RF signal receiving systems, such as television signal receivers.

It is desirable for a television signal receiver to receive television signals which have proper signal strength throughout the entire broadcast television band, so that a user can always enjoy good quality pictures and sound. However, the signal strength of individual television channels being received at a particular geographical location often varies from one another primarily due to the difference of the geographical distance between each one of the broadcast stations and the receiving location of the user. When the receiver tunes to a television channel having undesirable signal characteristics (e.g., either too weak or strong interference present), such a condition could cause several problems including undesirable noise in the pictures due to poor signal-to-nose ratio (S/N) and cross modulation caused by interference from the adjacent frequency signals for analog reception. Moreover, these problems are especially harmful for the reception of digital broadcast signals since reception is totally lost when the quality of the signals falls below a particular threshold.

A conventional way to solve the weak signal problem is to selectively apply an additional amplifier optimized for low noise figure between an antenna and a tuner in response to the automatic gain control (AGC) signal, which represents the strength of the television signals received. For example, The U.S. Pat. No. 5,638,141, entitled BROADCAST SIGNAL RECEIVER HAVING A LOW-NOISE AMPLIFIER INSERTED BEFORE A TUNER, filed by Bae et al., assigned to Samsung Electronics Co., Ltd., and issued Jun. 10, 1997 discloses this type of solution. Yet, the conventional solution is not a preferable solution to the problems addressed above because the AGC signal does not represent quality of the television signals (i.e., picture and/or sound quality) but merely represents the quantity (i.e., signal strength) of the television signal being received. Furthermore, the AGC signal does not reflect the strength of the signals on the adjacent channel frequencies, which could cause the interference problem. Therefore, a need exists for an RF signal processing circuit which optimizes the level of input television signals at each one of the television channels in response to the quality of the television signals and/or in response not only to the strength of the tuned signal but also to that of the adjacent signals.

In accordance with an aspect of the invention, a signal processing arrangement comprises a signal source for providing an RF signal, a signal output point, and first control means coupled between the signal source and the signal output point for controlling the magnitude of the RF signal in response to the magnitude of an RF signal on a tuned channel frequency and the magnitude of an RF signal on a channel frequency in the vicinity of the tuned channel frequency.

In accordance with another aspect of the present invention, a signal processing method comprising the steps of tuning to a channel frequency, retrieving information concerning RF signals on the tuned channel frequency and a channel frequency in the vicinity of the tuned channel frequency from a memory, and enabling an RF amplifier if the information indicates that the magnitude of an RF signal on the tuned channel frequency is below a first predetermined threshold level and the magnitude of an RF signal in the vicinity of the tuned channel frequency is below a second predetermined threshold level.

In accordance with another aspect of the present invention, a signal processing method comprising the steps of tuning to a channel frequency, retrieving information concerning RF signals on the tuned channel frequency and an RF signal in the vicinity of the tuned channel frequency from a memory, and disabling an RF amplifier if the information indicates that either the magnitude of an RF signal on the tuned channel frequency is above a first predetermined threshold level or the magnitude of an RF signal in the vicinity of the tuned channel frequency is above a second predetermined threshold level.

These and other aspects of the invention will be described in detail with respect to the accompanying drawings.

The exemplifications set out herein illustrate preferred embodiments of the invention, and such exemplifications are not to be construed as limiting the scope of the invention in any manner. In the various figures, the same or similar reference designations are used to identify the same or similar elements.

This application discloses a first signal processing arrangement which comprises a signal source, such as an antenna, for providing an information bearing RF signal, such as an analog and/or digital television signal, a signal output point, and control means, including an attenuator and/or an amplifier such as a low noise figure amplifier, together with RF switches associated therewith, coupled between the signal source and the signal output point for controlling the magnitude of the information bearing RF signal in response to quality of the information borne by the RF signal. The signal processing arrangement may further comprise determining means, such as a demodulator, coupled to the control means for determining the quality of the information borne by said RF signal. According to an exemplary embodiment described in detail below, such quality of the information is indicated by several signal parameters including automatic color control (ACC) level, picture to sound ratio (P/S) for reception of analog television signals, and signal to noise ratio (S/N), equalizer taps, and bit error rate (BER) for reception of digital television signals. A method performed by the foregoing arrangement is also disclosed herein.

Furthermore, this application discloses a second signal processing arrangement which comprises a signal source, such as an antenna, for providing a RF signal, such as an analog and/or digital television signal; a signal output point; and first control means, including an attenuator and RF switches associated therewith, coupled between the signal source and the signal output for controlling the magnitude of the RF signal in response to the magnitude of the RF signal on the tuned channel frequency as well as to that of an RF signal in the vicinity of the tuned channel, including one adjacent or near to the tuned channel frequency. The signal processing arrangement may further comprise a memory for storing channel information concerning the magnitude of the RF signal for every receivable signal throughout a band of frequencies including the magnitude of the RF signal for the channel being tuned and those for the channels in the vicinity of the tuned channel, and second control means including a microprocessor coupled to the first control means for controlling the first control means in response to the channel information stored on the memory. A method performed by this arrangement is also disclosed herein.

Figure 1:
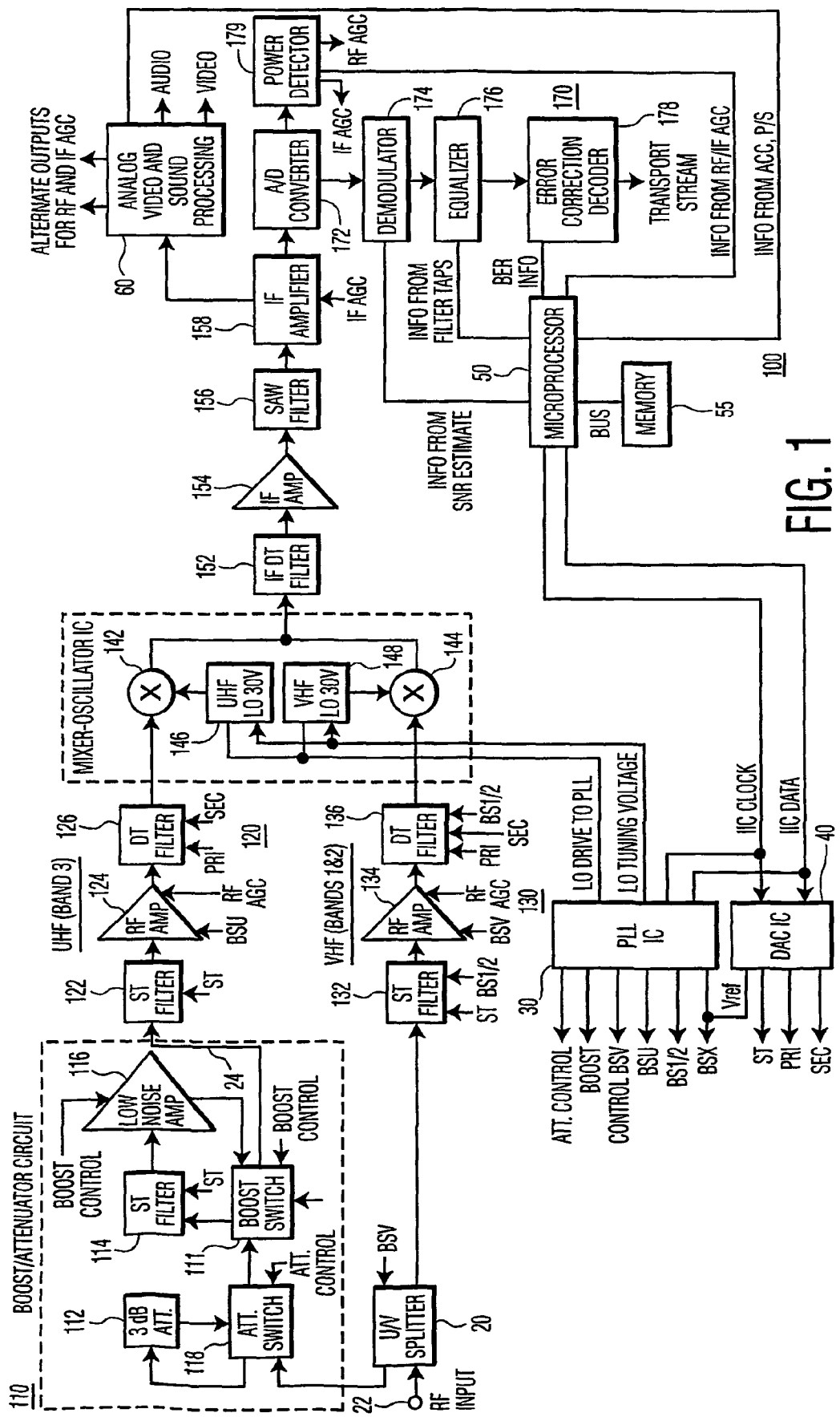
FIG. 1 is a block diagram illustrating a portion of an analog/digital television signal receiver which includes a first exemplary embodiment of the signal processing arrangement in accordance with the principles of the present invention.
Figure 2:
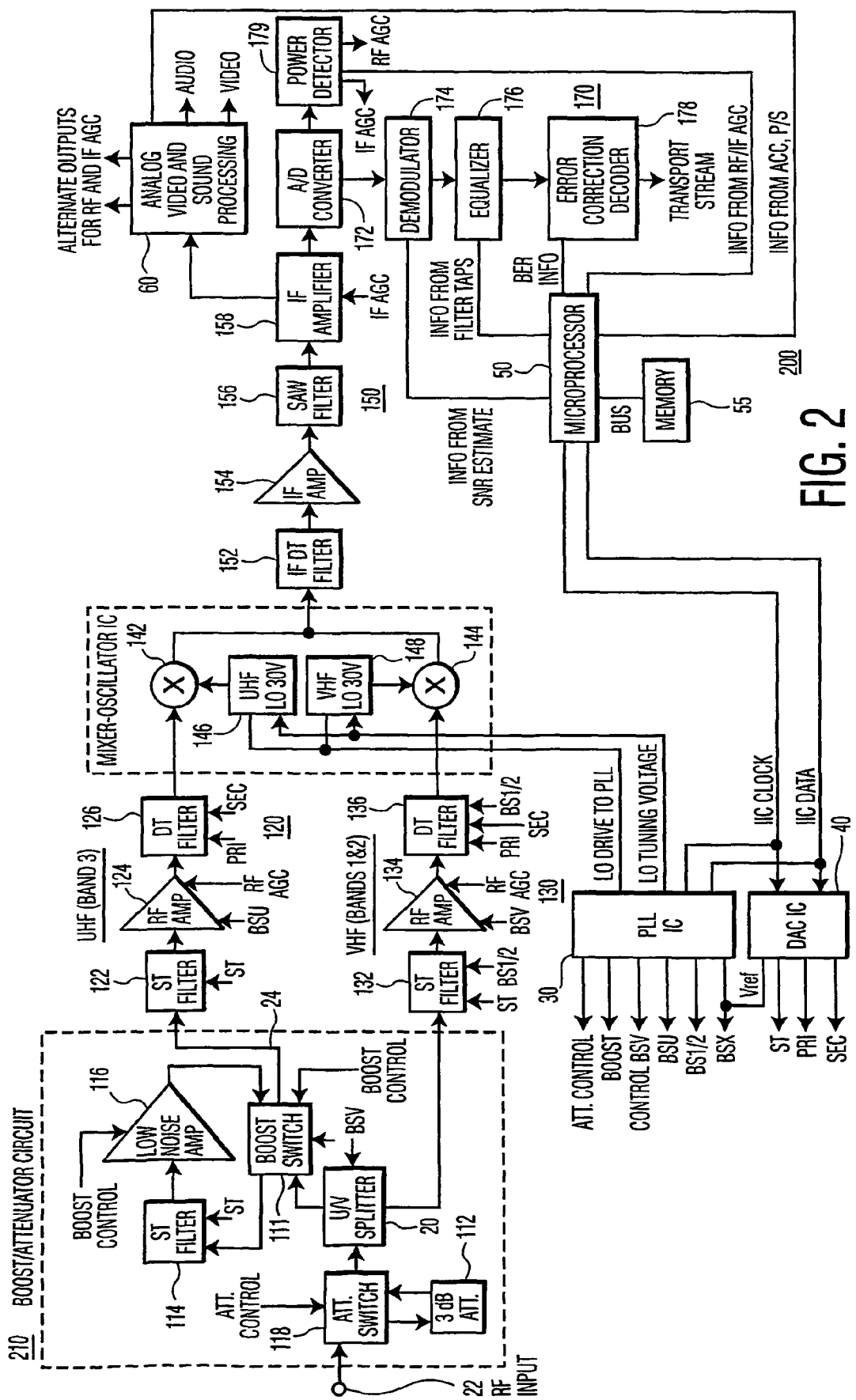
FIG. 2 is a block diagram illustrating a portion of an analog/digital television signal receiver which includes a second exemplary embodiment of the signal processing arrangement in accordance with the principles of the present invention.

Referring now to the drawings, and more particularly to FIGS. 1 and 2, block diagrams 100 and 200 shows two exemplary implementations of boost/attenuator circuits 110 and 210 respectively in conjunction with an analog/digital color television signal receiver. The foregoing first and second signal processing arrangements, as well as the methods performed by the respective ones of the arrangements, are equally applicable to each one of the implementations illustrated in FIGS. 1 and 2.

FIG. 1 discloses an exemplary implementation boost/attenuator circuit 110 in conjunction with an analog/digital television signal receiver. Off-the-air digital and/or analog television signals are received at an antenna (not shown) and are then applied to RF input point 22 of U/V splitter 20 via an RF signal transmission line (not shown) such as a coaxial cable. U/V splitter 20 separates the UHF television signals from the VHF television signals in a frequency domain and supply the UHF television signals to attenuator switch 118 which is part of boost/attenuator circuit 110. Although FIG. 1 shows boost/attenuator circuit 110 being implemented in the UHF signal processing path, it can also be implemented in the VHF signal processing path in the same manner.

Attenuator switch 118 provides the UHF television signals to either attenuator 112 (e.g., 3 dB resistive RF attenuator) or to boost switch 111 in response to an attenuator control signal from PLL IC 30 which is generated by microprocessor 50 and transmitted via the I²C bus. Boost switch 111 receives the UHF signals from attenuator switch 118 and provides them to either tunable single-tuned (ST) filter 114 of boost/attenuator circuit 110 or to tunable signal-tuned (ST) filter 122, usually located at the input of the RF circuit in a television tuner of the television signal receiver, in response to a boost control signal from PLL IC 30 which is generated by microprocessor 50 and transmitter via I²C bus.

Tunable single-tuned (ST) filter 114 of boost/attenuator circuit 110 attenuates the undesirable signals which might cause cross-modulation interference. Filter 114 is designed with a wider bandwidth than typical of a standard tuner input filter 122. Such a design reduces loss such that the noise figure performance of amplifier 116 is not significantly degraded while affording some protection from interference. Tuning signal ST for the filter is generated by digital to analog converter (DAC) IC 40 which is controlled by microprocessor 50 via the I²C bus. Tunable single-tuned (ST) filter 114 also operates as a tunable impedance matching network between RF input point 20 and low noise amplifier 116 to provide better impedance matching between the antenna and low noise amplifier 116 at a given frequency (e.g., a receiving frequency). Better impedance matching improves the voltage standing wave ratio (VSWR) between the antenna and low noise amplifier 116 resulting in reducing undesirable signal losses and impulse responses. Low noise amplifier 116 is activated by the boost control signal from PLL IC 30 which is generated by microprocessor 50 and transmitted via I²C bus. Although a fixed-gain amplifier is used as low noise amplifier 116 in FIG. 1, a gain-controlled amplifier may also be used with a proper gain control circuit. The output signal of boost switch 111 is applied to single-tuned tunable filter 122.

UHF tuner circuit 120 includes tunable single-tuned filter 122, gain-controlled RF amplifier 124, tunable double-tuned (DT) filter 126, mixer 142, UHF local oscillator 146, and double-tuned (DT) IF filter 152. The gain of gain-controlled RF amplifier 124 is controlled in response to the RF AGC signal generated by either analog video and sound processing circuit 60 (for analog signal reception) or by power detector 179 (for digital signal reception). UHF tuner circuit 120 converts UHF television signals to IF television signals and is usually located in a tuner module of the television signal receiver.

The IF signals coming out of double-tuned IF filter 152 are then processed in IF signal processing circuit 150 including IF amplifier 154, SAW filter 156, and gain-controlled IF amplifier 158. The gain of gain-controlled IF amplifier 158 is controlled in response to the IF AGC signal generated by either analog video and sound processing circuit 60 (for analog signal reception) or by power detector 179 (for digital signal reception). The output signals of gain-controlled amplifier 158 apply to the subsequent analog signal processing circuit including analog video and sound processing circuit 60 and to subsequent digital signal processing circuit 170 including analog-to-digital converter 172, power detector 179, demodulator 174, equalizer 176, and error correction decoder 178.

Analog video and sound processing circuit 60 demodulates analog television signals, such as NTSC, PAL and SECAM television signals, and generates RF and IF AGC signals which control gain-controlled RF amplifier 124 and gain-controlled IF amplifier 158 respectively in response to the quantity (i.e., magnitude) of the RF analog television signals. Analog video and sound processing circuit 60 includes an analog-to-digital converter and provides microprocessor 50 with the parameter information representing such RF and IF AGC signals as digital data. Similarly, analog video and sound processing circuit 60 provides microprocessor 50 via the I²C bus with the parameter information in digital form representing automatic chroma control (ACC) signal and picture-to-sound carrier ratio (P/S), each one of which indicates the different aspects of picture quality of the analog RF television signals.

Digital signal processing circuit 170 processes digital television signals, such as QAM, QPSK, and HD VSB signals. Analog-to-digital (A/D) converter provides digitized IF signals for demodulator 174 and power detector 179, both of which are usually located on a digital demodulator IC. Power detector 172 generates RF and IF AGC signals which control gain-controlled RF amplifier 124 and gain-controlled IF amplifier 158 respectively in response to the quantity (i.e., magnitude) of the RF digital television signals. Power detector 172 provides microprocessor 50 via the I²C bus with the parameter information representing such RF and IF AGC signals. The determination of the AGC level is performed based upon the digitized IF signals which have not yet been demodulated.

Demodulator 174 demodulates the digitized IF signals from A/D converter 172 and provides so-called the "digital base-band signals." Demodulator 174 also generates the parameter information representing the signal-to-noise ratio (S/N), which indicates one of the aspects of picture and sound quality of the RF digital television signals and provides microprocessor 50 via the I²C bus with such information.

Equalizer 176 receives the digital base-band signals from demodulator 174 and attempts to correct their impulse responses. The impulse response may be degraded by transmission channel multipath effects as imperfections of the antenna and tuner input circuitry. Equalizer 176 also generates the parameter information representing the filter taps, which indicates one of the aspects of the quality of the RF digital television signals, and provides microprocessor 50 via the I²C bus with such information. By monitoring these equalizer taps, the above circuitry can be selected to reduce the effects of the antenna and tuner input imperfections.

The output signals of equalizer 176 apply to error correction decoder 178 which performs error correction on the digital base-band signals by the Reed-Solomon decoding procedure. Error correction decoder 178 generates the parameter information representing bit error rate (BER), which indicates one of the aspects of picture and sound quality of the RF digital television signals, and provides microprocessor 50 via the I²C bus with such information.

The output signals of error correction decoder 178 are then processed by the subsequent signal processing circuit (not shown). Microprocessor 50, via PLL IC 30 and digital-to-analog converter (DAC) IC 40, controls the operations of boost/attenuator circuit 110 based upon the foregoing various parameter information in the manner disclosed in FIG. 3.

FIG. 2 discloses another exemplary implementation of the boost/attenuator circuit 210 in conjunction with an analog/digital television signal receiver. In this implementation, attenuator 112 with attenuator switch 118 is now placed between RF input 22 and U/V splitter 20 so that both the VHF and UHF television signals may be attenuated in response to the attenuator control signal generated by PLL IC 30 which is controlled by microprocessor 50 via the I²C bus. The UHF television signals are filtered by tunable single-tuned (ST) filter 114 and then amplified by low noise amplifier 116 in response to the boost control signal in the same manner as described above in conjunction with FIG. 1. The VHF television signals separated by U/V splitter 20 from the UHF television signals apply to VHF tuner circuit 130 which includes tunable single-tuned (ST) filter 132, RF amplifier 134, tunable double-tuned (DT) filter 136, mixer 144, VHF local oscillator 144, and double-tuned (DT) IF filter 152. Double-tuned (DT) IF filter 152 are used for both VHF and UHF signal processing as a common element. VHF tuner circuit 130 converts television VHF signals into television IF signals and is usually located in a tuner module of a television signal receiver. The functions of IF signal processing circuit 150, analog video and sound processing circuit 60, and digital signal processing circuit 170 are the same as those explained above in conjunction with FIG. 1. Microprocessor 50, via PLL IC 30 and digital-to-analog converter (DAC) IC 40, controls the operation of boost/attenuator circuit 110 based upon the foregoing various parameter information in the manner disclosed in FIG. 4.

Figure 3:
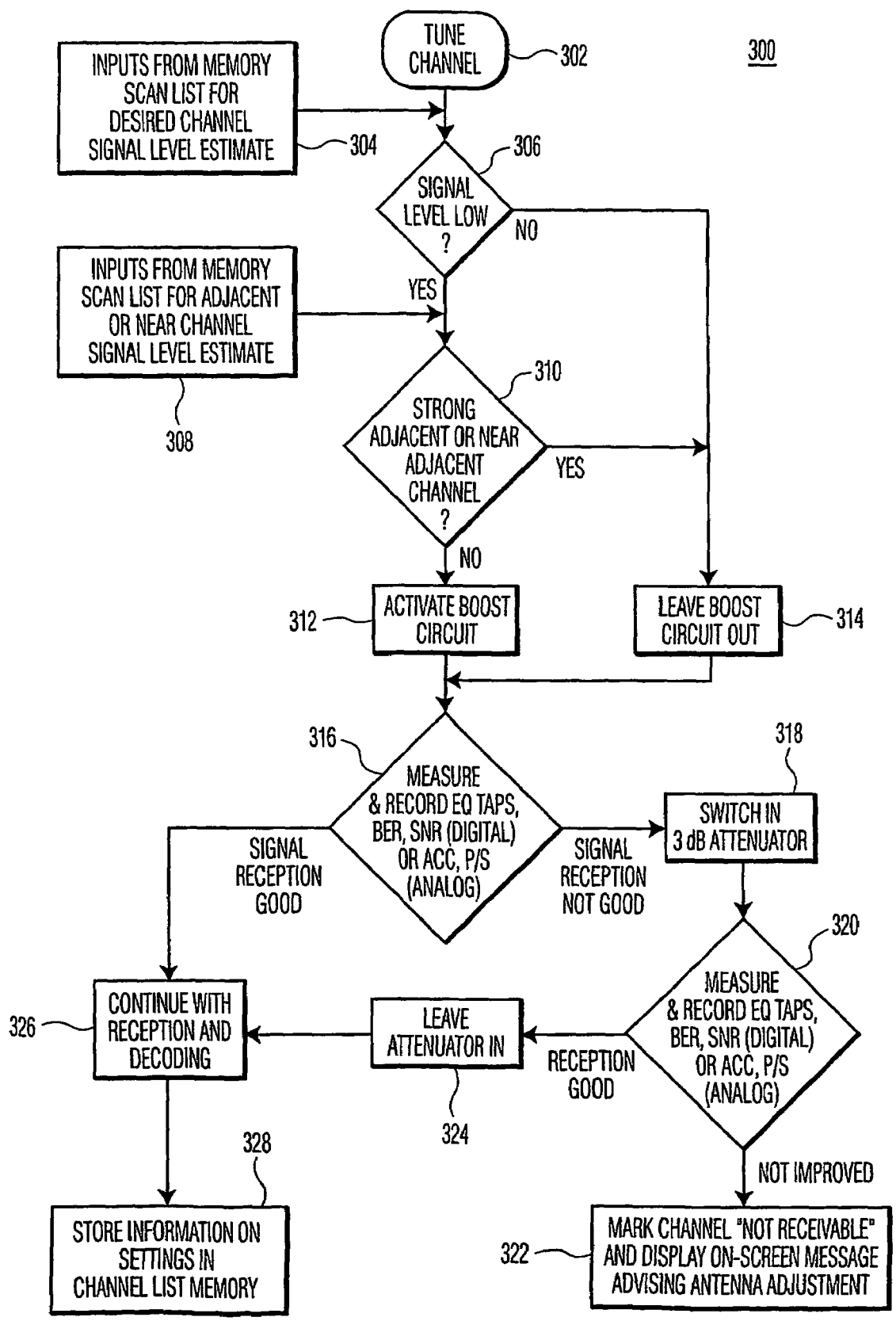
FIG. 3 is a flow chart describing an exemplary manner of operation of the first embodiment as illustrated in FIG. 1 in accordance with the principles of the present invention.

Referring now to FIG. 3, flow chart 300 discloses an exemplary manner of operation of boost/attenuator circuit 110 shown in FIG. 1, which is supplemental or in addition to the various manners of operation of the entire circuit disclosed herein. In step 302, a television tuner is tuned to a particular UHF television channel. In step 304, microprocessor 50 retrieves the previously-stored AGC parameter data from memory 55. The determination of the AGC level for the individual receivable channels throughout the entire VHF/UHF television bands is usually performed when a user initially sets up the television signal receiver, and such individual AGC information can be stored in a memory to form a so-called "memory scan list."

In step 306, microprocessor 50 compares the stored AGC level for the tuned channel to a predetermined threshold. If the current AGC level is not lower than the threshold, then the boost/attenuate circuit 110 will be bypassed as indicated in step 314. However, if the level is lower than the threshold, then in step 308 microprocessor 50 acquires the AGC levels of the adjacent channel signals from memory 55. In step 310, if one of the adjacent channel AGC levels is stronger than a predetermined level, boost/attenuator circuit 110 is bypassed. If not, in step 312, low-noise amplifier 116 is enabled and applied.

In step 316, the various parameters which indicate the quality of the information borne by the tuned UHF television signal, such as EQ taps, BER, SNR, ACC, and P/S, are measured as described above. If such parameters indicate that signal quality is unacceptable, attenuator 112 is enabled and applied as indicated in step 318. If such parameters indicate that signal quality is acceptable, the television signal receiver continues to receive the tuned signal as indicated in step 326, and the channel data, including the measured parameter data as well as the present operation mode of boost/attenuator circuit 110 (i.e., whether or not low-noise amplifier 116 is enabled), for this particular channel can be stored in memory 55 as indicated in step 328.

In step 320, the foregoing various parameters are again measured to determine the effect of attenuator 112. If the measured parameters indicate that the picture and/or sound qualities have/has improved, attenuator 112 is continued to be enabled and applied as indicated in step 324. If, however, the parameters indicate that the application of attenuator 112 does not improve the picture and/or sound qualities, the message "Channel Not Receivable" is displayed on the screen and such information is stored on memory 50 as indicated in step 322.

Figure 4:
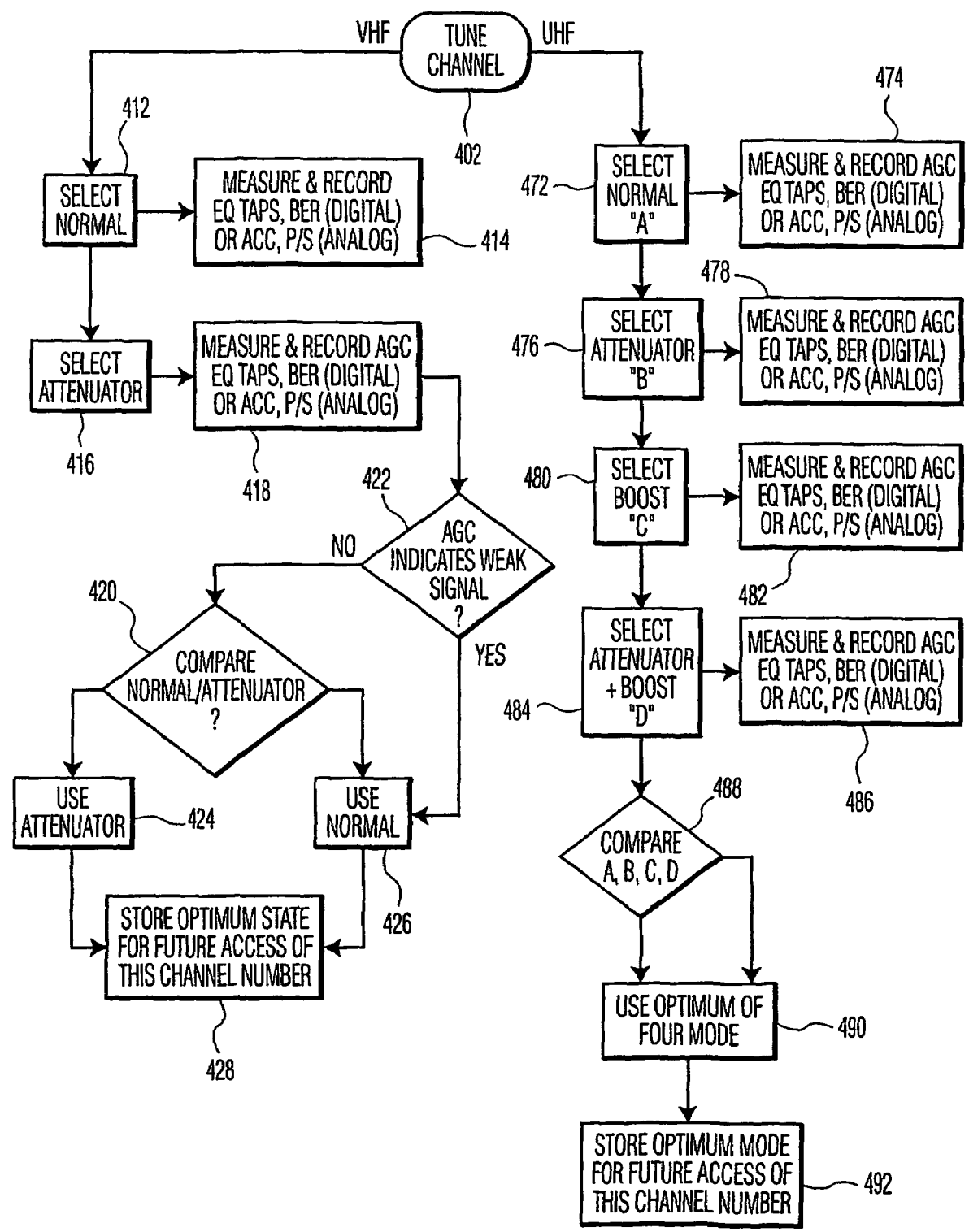
FIG. 4 is a flow chart describing an exemplary manner of operation of the second embodiment as illustrated in FIG. 2 in accordance with the principles of the present invention.

Referring now to FIG. 4, flow chart 400 discloses an exemplary manner of operation of boost/attenuator circuit 210 shown in FIG. 2, which is supplemental or in addition to the various manners of operation of the entire circuit disclosed herein. In step 402, a television tuner is tuned to a particular VHF or UHF television channel. When a VHF channel is tuned, the various parameters which indicate the quality of the information borne by the tuned VHF television signal are measured. More specifically, these parameters are measured under two different modes of operation of boost/attenuator circuit 210. Under the "Normal" mode, attenuator 118 is bypassed so that the VHF television signals directly apply to tunable single-tuned (ST) filter 132 via U/V splitter 20 as indicated in step 412. Under the "Select Attenuator" mode, attenuator 118 is enabled and applied to the VHF television signals as indicated in step 416. The measured parameter data under the respective operation modes are stored onto memory 55 as indicated in steps 414 and 418.

After measuring the various parameter information, the magnitude of the VHF television signals is determined by evaluating the AGC signals in step 422. If the VHF televisions signals are so weak that they might not be suitable for proper reception, attenuator 118 is disabled and bypassed as indicated in step 426.

In step 420, the results of the foregoing measurements under the different operation modes are compared, and whichever the mode provides a better picture and/or sound condition is continued to be used. That is, if the application of attenuator 118 provides a better picture and/or sound condition, attenuator 118 is enabled and applied for reception of the tuned channel as indicated in step 424. If not, attenuator 424 is bypassed as indicated in step 426. In step 428, the information representing the selected operation mode (i.e., use or non-use of attenuator 116) for this particular television channel is stored onto memory 55 for the future access to this channel.

When a UHF channel is tuned, the various parameters which indicate the quality of the information borne by the tuned UHF television channel are measured under four different operation modes of boost/attenuator circuit 210. Under the "Normal" mode, both attenuator 118 and low-noise amplifier 116 are bypassed so that the UHF television signals directly apply to tunable single-tuned (ST) filter 122 via U/V splitter 20 as indicated in step 472. Under the "Select Attenuator" mode, attenuator 118 is enabled and applied to the UHF television signals but low-noise amplifier 116 is bypassed as indicated in step 476. Under the "Select Boost" mode, low-noise amplifier 116 is enabled and applied to the UHF television signals but attenuator 118 is bypassed as indicated in step 480. Under the "Select Attenuator+Boost" mode, both attenuator 118 and low-noise amplifier 116 are enabled and applied to the UHF television signals. The measured parameter data under the respective operation modes are stored onto memory 55 as indicated in steps 474, 478, 482, and 486.

In step 488, all the measurement results under the respective four operation modes are compared, and whichever the mode provides the best picture and/or sound condition is continued to be used as indicated in step 490. In step 492, the information representing the selected best operation of boost/attenuator circuit 210 (i.e., whether or not either or both attenuator 118 and low-noise amplifier is or are enabled) for this particular UHF television channel is stored onto memory 55 for the future access to this channel.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

For example, boost/attenuate circuit 110 and its control methods can be used for analog/digital broadcast radio receivers, and boost/attenuate circuit 110 can be placed anywhere between an antenna and an RF input point of the front-end circuit of a television tuner module. That is, boost/attenuate circuit 110 could be implemented in a television signal receiver set, could be placed in a separate module external to a television signal receiver set, or could be implemented in an antenna assembly.

The term "television signal receiver" used herein includes any television signal receiver with or without display. For example, the term "television signal receivers" includes but is not limited to video cassette recorders (VCR's), DVD players, and set-top boxes.

The invention claimed is:

1. A signal processing method comprising the steps of:
tuning to a channel frequency;
measuring the magnitude of a first radio frequency (RF) signal at a first channel frequency;
storing said magnitude of said first radio frequency signal in a first memory location;
measuring the magnitude of a second radio frequency (RF) signal at a second channel frequency in the vicinity of said first channel frequency;
storing said magnitude of said second radio frequency signal in a second memory location; and
enabling an RF amplifier if the magnitude of said first RF signal on said first channel frequency is below a first predetermined threshold level and the magnitude of a second RF signal at a second channel frequency in the vicinity of said first channel frequency is below a second predetermined level.

2. A method of processing a signal comprising the steps of:
tuning to a first channel frequency;
measuring the magnitude of a first radio frequency (RF) signal at said first channel frequency;
storing said magnitude of said first radio frequency signal in a first memory location;
measuring the magnitude of a second radio frequency (RF) signal at a second channel frequency in the vicinity of said first channel frequency;
storing said magnitude of said second radio frequency signal in a second memory location; and
disabling an RF amplifier if either the magnitude of said first RF signal on said first channel frequency is above a first predetermined threshold level or the magnitude of said second RF signal on said second channel frequency in the vicinity of said first channel frequency is above a second predetermined threshold level.

* * * * *